(12) United States Patent  
Johansson et al.

(10) Patent No.: US 7,095,080 B2
(45) Date of Patent: Aug. 22, 2006

(54) RF POWER LDMOS TRANSISTOR WITH MULTIPLE GATE FINGERS

(75) Inventors: Jan Johansson, Upplands Väsby (SE); Nils Af Ekenstam, Vällingby (SE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 10/658,137

(22) Filed: Sep. 9, 2003

(65) Prior Publication Data

US 2004/0089897 A1 May 13, 2004

Related U.S. Application Data

(63) Continuation of application No. PCT/SE02/00414, filed on Mar. 7, 2002.

(30) Foreign Application Priority Data

Mar. 9, 2001 (SE) .................................. 0100804

(51) Int. Cl.
*H01L 29/76* (2006.01)
*H01L 29/94* (2006.01)
(52) U.S. Cl. ...................................... 257/341; 257/401
(58) Field of Classification Search ............... 257/249, 257/275, 340, 341, 401, 659, 750
See application file for complete search history.

(56) References Cited

U.S. PATENT DOCUMENTS 5,369,045 A * 11/1994 Ng et al. ..................... 438/286
5,681,761 A 10/1997 Kim ............................. 437/21
6,744,117 B1 * 6/2004 Dragon et al. .............. 257/659

* cited by examiner

Primary Examiner—Michael Trinh
Assistant Examiner—Monica Lewis
(74) Attorney, Agent, or Firm—Baker Botts L.L.P.

(57) ABSTRACT

In an RF power LDMOS transistor comprising multiple pairs of parallel gate fingers (11) located on opposite side of an associated $p^+$ sinker (23), and metal clamps (14) for short-circuiting the $p^+$ sinkers (23), each gate finger (11) of a pair is associated with separate metal clamps (14) that short-circuit the $n^+$ source region (20) and the $p^+$ sinker (23) associated with particular gate finger (11). The separate metal clamps (14) associated with each gate finger pairs are separated by a slot (15) that extends between the parallel gate fingers (11), and a metal runner (13) extends in the slot (15) between the separate metal clamps (14) associated with each finger pair from a gate pad. Both gate fingers (11) of a gate finger pair are connected to the associated metal runner (13) at both ends and at predetermined positions along their lengths.

5 Claims, 2 Drawing Sheets

RF POWER LDMOS TRANSISTOR WITH MULTIPLE GATE FINGERS

CROSS REFERENCE TO RELATED APPLICATION

This application is a continuation of copending International Application No. PCT/SE02/00414 filed Mar. 7, 2002, which designates the United States, and claims priority to Swedish application number 0100804-4 filed Mar. 9, 2001.

TECHNICAL FIELD OF THE INVENTION

The invention relates generally to RF power LDMOS transistors and more specifically to such transistors for use in third generation wireless communication systems.

BACKGROUND OF THE INVENTION

Discrete RF power LDMOS transistors are primarily used for building power amplifiers used in radio base stations.

A top view of a portion of the layout of a traditional RF power LDMOS transistor is illustrated in FIG. 1. The transistor comprises a number of parallel LDMOS transistor cells, two of which are shown in FIG. 1, where the cells are an interdigitated finger structure containing pairs of drain fingers 1, pairs of gate fingers 2 and source/bulk metal clamps 3. The drain fingers 1 and the gate fingers 2 are connected to a drain feeder bar 4 and a gate feeder bar 5, respectively, on opposite sides of the transistor cells as shown in FIG. 1. Traditional LDMOS Power transistors comprise a number of parallel cells.

However, third generation (3G) wireless systems set new demands on RF power transistors. Not only higher frequency (>2 GHz), which in itself is a challenge, but extreme demands on linearity has compelled designers of power amplifiers to use power transistors way below their rated maximum output power. It is at this backed off output power level the transistors must perform, i.e. have high gain and good efficiency.

These new demands have forced RF power transistor designers to leave the old "parallel cells" layout of the transistors and switch to a slightly different design. The 3G design uses only one interdigitated transistor cell, rotated 90 degrees compared to the orientation of the cells in the older design.

The largest benefit with this new design is a considerably reduced transistor periphery per active transistor area, which in turn results in lower output capacitance and improved efficiency.

In order to make the gate periphery equal to a transistor with multiple parallel cells, the single cell needs to be stretched in both dimensions, so that it contains many more fingers. In order to keep a decent aspect ratio of the transistor die, the fingers also need to be much longer.

The principle for the 3G design is shown in FIG. 2 which is a top view of a portion of the layout of a known 3G RF power LDMOS transistor. Pairs of drain fingers 6, of which only one pair is shown in FIG. 2, are connected to a common drain bond pad (not shown). Pairs of gate fingers 7, of which only one pair is shown in FIG. 2, are interconnected at their ends and at predetermined positions along their lengths by pieces of a first metal layer. One such interconnection piece 8 is shown in FIG. 2. Source/bulk metal clamps 9, also produced from said first metal layer, extend over the pair of gate fingers 7 between the interconnection pieces.

As described above, the 3G design is unavoidably associated with longer fingers. This is a problem especially on the gate side of the transistor. The gate fingers are usually made of highly doped polysilicon, possibly with a layer of metal silicide on top, in order to reduce the resistivity. However, the resistance in the gate fingers is far from negligible, and at some point the length of the gate fingers will affect transistor performance negatively.

The way this problem has been solved in the known 3G design of the transistor is by introducing a second metal layer. By doing this, one can design a metal runner 10 on top of the source/bulk clamps 9. The metal runner 10 is isolated from the clamps 9 by a dielectric layer (not shown in FIG. 2), and is connected to the pair of gate fingers 7 at predetermined positions along the length of gate fingers 7 via the interconnection piece 8 as well as at their respective ends. One end of the metal runners 10 is connected to a common gate bond pad (not shown).

Hereby, the effective length of each gate finger will be equal to half the distance between two gate interconnection pieces.

However, the introduction of the second metal layer in the transistor design adds complexity both to the design and to the production process. In this connection, it should be pointed out that in FIG. 2, the drain fingers 6 are made up of two metal layers, namely the second metal layer on top of the first metal layer. Two extra mask steps together with a number of extra process steps need to be added to the production process of the transistor die.

SUMMARY OF THE INVENTION

The object of the invention is to bring about a 3G RF power LDMOS transistor that is less complex to produce than those known so far.

This is attained by means of the transistor according to the invention mainly by using only one metal layer with intermediate contact to the long gate fingers.

An RF power LDMOS transistor may comprise multiple pairs of parallel gate fingers, the gate fingers of each gate finger pair being located on opposite sides of an associated p+ sinker, and metal clamps being provided to short-circuit the p+ sinkers and n+ source regions on opposite sides of the p+ sinkers, wherein each gate finger of a gate finger pair is associated with separate metal clamps that short-circuit the n+ source region and the p+ sinker associated with that particular gate finger, wherein the separate metal clamps associated with each gate finger pair are separated by a slot that extends between the parallel gate fingers, a metal runner that extends in the slot between the separate metal clamps associated with each gate finger pair from a gate pad, and wherein both gate fingers of a gate finger pair are connected to the associated metal runner at both their ends and at predetermined positions along their lengths.

The metal runners may be provided on a dielectric layer on top of the p+ sinkers. Each metal clamp may cover the associated gate finger to shield it from a respective drain region. The transistor may further comprise a well which extends from under the gate fingers and encloses said source regions. The transistor may further comprise source regions extending lateral from each side of said well. The source region may comprise a first region and a second region surrounding said first region, wherein the second region is less doped than said first region.

An RF power LDMOS transistor may comprise a substrate, a first and second source region spaced apart, a sinker separating said first and second source region, a first and second drain region arranged to define in combination with said first and second source region a first and second channel, a first and second gate finger covering said first and second channel, respectively, first and second metal clamps which short-circuit the sinker and respective source regions on opposite sides of the sinker, wherein the first and second metal clamps are separated by a slot that extends between the parallel gate fingers, and a metal runner that extends in the slot between the separate metal clamps.

Both gate fingers can be connected to the associated metal runner at both their ends and at predetermined positions along their lengths. The metal runner can be provided on a dielectric layer on top of the sinker. Each metal clamp may cover the associated gate finger to shield it from a respective drain region. The transistor may further comprise a well which extends from under the gate fingers and encloses said source regions wherein said well defines the channel. Each source region may comprise a first region and a second region surrounding said first region, wherein the second region is less doped than said first region.

BRIEF DESCRIPTION OF THE DRAWINGS

The invention will be described more in detail below with reference to the appended drawing on which.

DETAILED DESCRIPTION OF THE PREFERRED EMBODIMENTS

Figure 3:
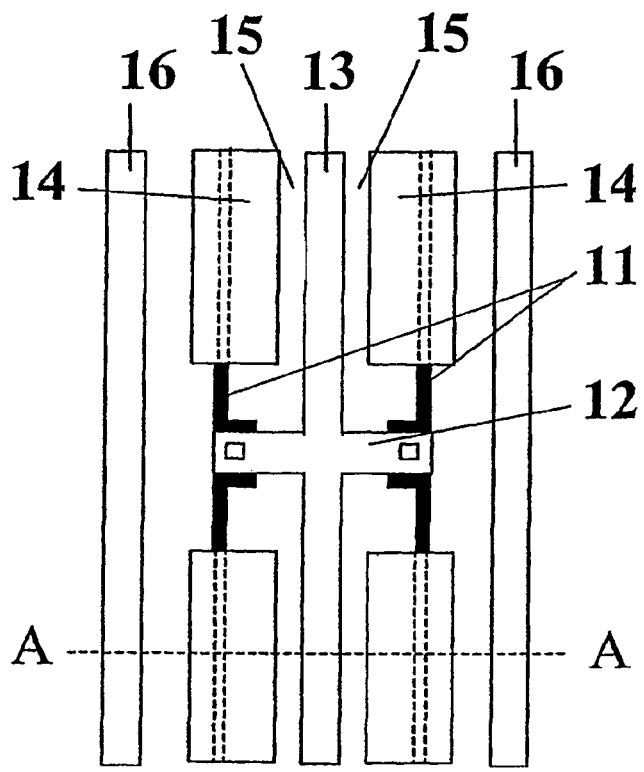
FIG. 3 shows the layout of a 3G RF power LDMOS transistor according to the invention.

FIG. 3 shows the layout of a 3G RF power LDMOS transistor according to the invention.

Figure 1:
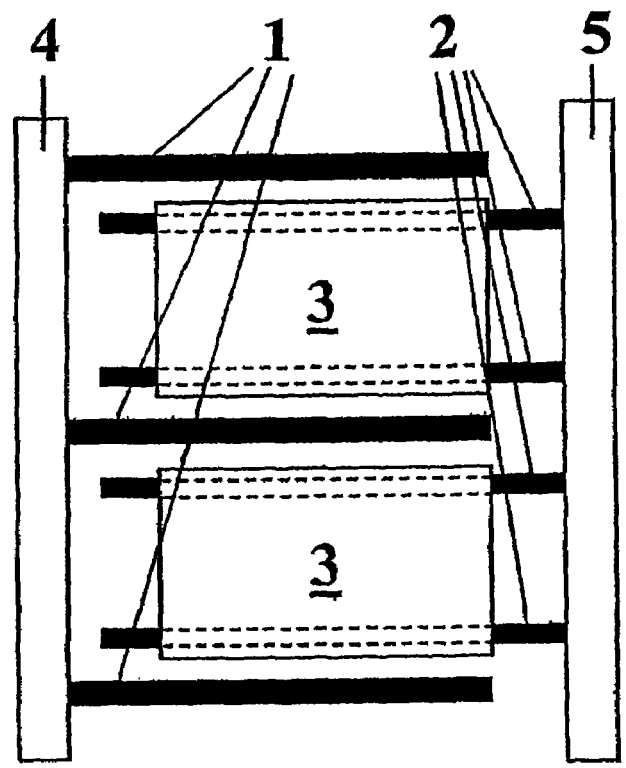
FIG. 1 described above shows the layout of a traditional RF power LDMOS transistor, FIG. 2 described above shows the layout of a known 3G RF power LDMOS transistor.
Figure 2:
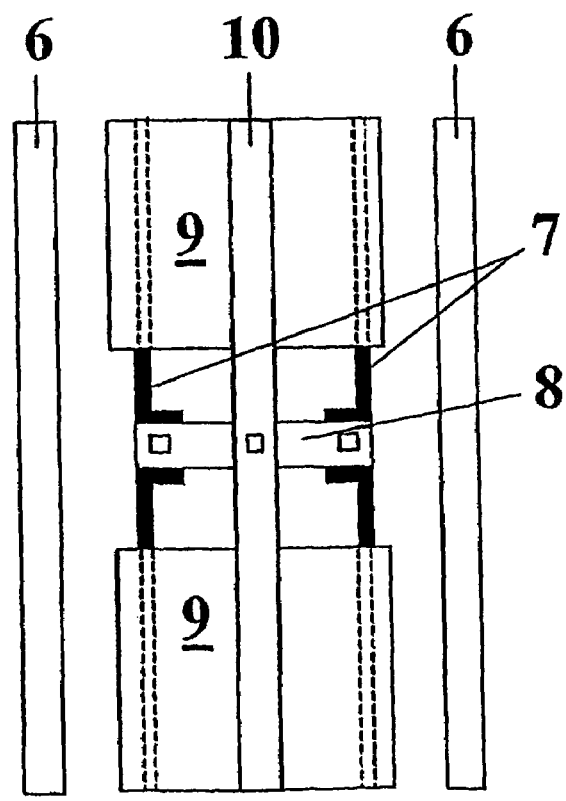

Contrary to the known 3G transistor in FIG. 2, that comprises two metal layers, the 3G transistor according to the invention comprises only one metal layer.

In the transistor according to the invention in FIG. 3, gate fingers 11 of each pair of gate fingers are interconnected at their ends and at predetermined positions along their lengths by pieces of a metal layer. One such interconnection piece 12 is shown in FIG. 3.

In accordance with the invention, a metal runner 13 that is connected to a common gate bond pad (not shown), is produced for each pair of gate fingers 11 in one piece with the interconnection pieces 12 for the respective pair of gate fingers.

Also in accordance with the invention, separate source/bulk metal clamps 14, produced from the same metal layer as the interconnection pieces 12 and the metal runners 13, are associated with each gate finger 11 of each pair of gate fingers. The metal clamps 14 associated with the respective gate finger 11 of a pair of gate fingers, are separated by a slot 15 that extends between the parallel gate fingers 11 of each gate finger pair.

In accordance with the invention, the metal runners 13 are produced in the slots 15 between the metal clamps 14.

Pairs of drain fingers 16, produced from the same metal layer as the interconnection pieces 12, the metal runners 13, and the metal clamps 14, are connected to a common drain bond pad (not shown) in the transistor.

Figure 4:
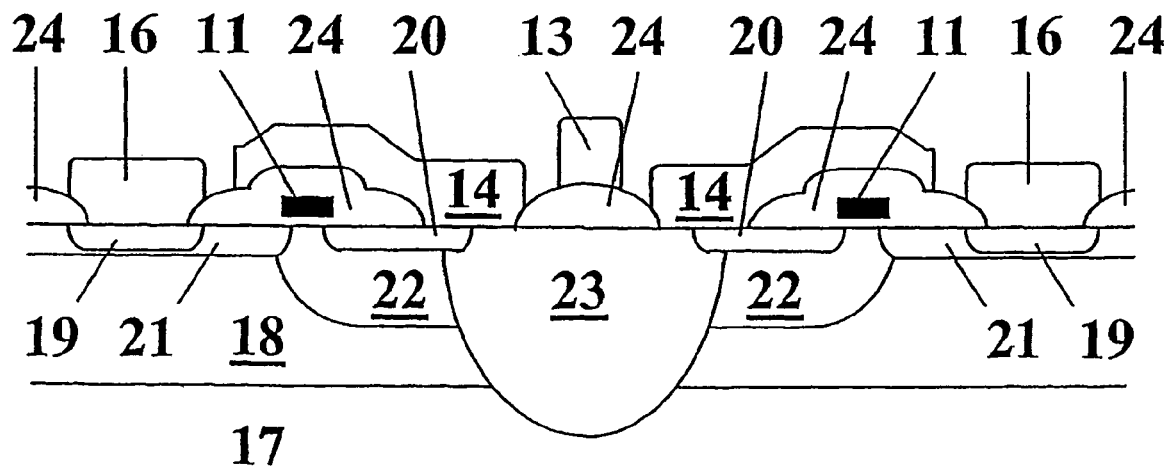
FIG. 4 is a cross-sectional view of the transistor according to the invention in FIG. 3 along line A—A.

FIG. 4 is a cross-sectional view of the transistor according to the invention along the line A—A in FIG. 3. In FIG. 4, the same reference numerals as in FIG. 3 are used to denote identical elements.

In a manner known per se, the transistor is built into a p+ substrate 17 with a p-epi 18 on top, and consists of alternating n+ drain regions 19 and n+ source regions 20 where the n+ drain region 19 is separated from the gate 11 by an n– drift region 21.

A p-type channel dopant or p-well 22 is diffused laterally in under the gate 11 from its source side.

A deep p+ diffusion or p+ sinker 23, enables current to be passed on from the n+ source region 20 to the p+ substrate 17 with minimal voltage drop by means of the metal clamp 14 shorting these regions to one another.

A dielectric layer 24 separates the gate fingers 11 from the metal clamps 14 and the metal runners 13 from the p+ sinker regions 23.

The invention claimed is:
1. An RF power LDMOS transistor comprising:
a substrate,
a first and second source region spaced apart, wherein each source region comprise a first region and a second region surrounding said first region, wherein the second region is less doped than said first region,
a sinker separating said first and second source region,
a first and second drain region arranged to define in combination with said first and second source region a first and second channel,
a first and second gate finger covering said first and second channel, respectively,
first and second metal clamps which short-circuit the sinker and respective source regions on opposite sides of the sinker,
wherein the first and second metal clamps are separated by a slot that extends between the parallel gate fingers, and
a metal runner that extends in the slot between the separate metal clamps.

2. The transistor according to claim 1, wherein both gate fingers are connected to the associated metal runner at both their ends.

3. The transistor according to claim 1, wherein the metal runner is provided on a dielectric layer on top of the sinker.

4. The transistor according to claim 1, wherein each metal clamp covers the associated gate finger to shield it from a respective drain region.

5. The transistor according to claim 1, further comprising a well which extends from under the gate fingers and encloses said source regions wherein said well defines the channel.

* * * * *